United States Patent
Son

(10) Patent No.: US 7,863,629 B2
(45) Date of Patent: Jan. 4, 2011

(54) ORGANIC LIGHT EMITTING DIODE DISPLAY DEVICE HAVING AN INTEGRATED SECONDARY BATTERY AND METHOD OF FABRICATING THE SAME

(75) Inventor: Hyun-Chul Son, Suwon-si (KR)

(73) Assignee: Samsung Mobile Display Co., Ltd. (KR)

( * ) Notice: Subject to any disclaimer, the term of this patent is extended or adjusted under 35 U.S.C. 154(b) by 325 days.

(21) Appl. No.: 11/935,943

(22) Filed: Nov. 6, 2007

(65) Prior Publication Data

US 2008/0111493 A1 May 15, 2008

(30) Foreign Application Priority Data

Nov. 10, 2006 (KR) .................... 10-2006-0111180

(51) Int. Cl.
H01L 33/00 (2010.01)
H01L 27/14 (2010.01)
H01L 21/00 (2010.01)

(52) U.S. Cl. .................... 257/88; 257/72; 313/506; 438/149

(58) Field of Classification Search ........... 313/483, 313/506; 445/24, 46, 49; 257/40, 66, 72, 257/88; 438/149, 152
See application file for complete search history.

(56) References Cited

U.S. PATENT DOCUMENTS 6,028,327 A    2/2000   Mizoguchi et al.
6,822,778 B2 * 11/2004 Westfall et al. ............. 359/265
6,930,331 B2 *  8/2005 Park et al. .................... 257/90
7,177,064 B2 *  2/2007 Park ............................ 359/270
7,463,399 B2 * 12/2008 Shin et al. .................... 359/265
7,510,891 B2 *  3/2009 Chun et al. .................... 438/29
2004/0135164 A1 *  7/2004 Park et al. .................... 257/99
2005/0023975 A1    2/2005 Lee et al.
2005/0174846 A1 *  8/2005 Kim et al. ............. 365/185.06
2007/0170859 A1 *  7/2007 Choi et al. .................. 313/512

FOREIGN PATENT DOCUMENTS

JP    2005-535120     2/2004
JP    2005-141934     6/2005
KR    10-2002-0049811 6/2002
KR    20-0320880      7/2003
KR    10-2005-0035595 4/2005

* cited by examiner

Primary Examiner—Thuy Vinh Tran
(74) Attorney, Agent, or Firm—Knobbe Martens Olson & Bear LLP

(57) ABSTRACT

An organic light emitting diode (OLED) display device and a method of fabricating the same are provided. An embodiment of the OLED display device comprises: a substrate; a secondary battery comprising a first electrode layer, a second electrode layer and an electrolyte layer interposed between the first and second electrode layers; a display panel comprising an array of organic light emitting diodes formed over the substrate, wherein the battery is interposed between the substrate and the display panel; and a power supply voltage line formed over the substrate and outside the display panel, wherein the power supply voltage line electrically interconnects the secondary battery and the display panel.

20 Claims, 4 Drawing Sheets

ORGANIC LIGHT EMITTING DIODE DISPLAY DEVICE HAVING AN INTEGRATED SECONDARY BATTERY AND METHOD OF FABRICATING THE SAME

CROSS-REFERENCE TO RELATED APPLICATIONS

This application claims the benefit of Korean Patent Application No. 2006-0111180, filed on Nov. 10, 2006, the disclosure of which is hereby incorporated herein by reference in its entirety.

BACKGROUND

1. Field

The present disclosure relates to an organic light emitting diode (OLED) display device and a method of fabricating the same, and more particularly, to an OLED display device having an integrated secondary battery capable of applying a voltage to a display panel, and a method of fabricating the same.

2. Description of the Related Technology

The cathode-ray tube (CRT) has been superseded by a flat panel display device (FPD) that can be fabricated to be lightweight and thin. Typical examples of the FPD include a liquid crystal display device (LCD) and an organic light emitting diode (OLED) display device. The OLED display device typically has a higher luminance and a wider viewing angle than the LCD, and may be made ultrathin since it typically does not need a backlight.

In the OLED, electrons and holes may be injected through a cathode and an anode and recombine in an organic thin layer to form excitons. Thus, the OLED emits light in a specific range of wavelengths determined by the energy created by the excitons.

The OLED display device may be classified into a passive matrix (PM) type and an active matrix (AM) type, depending on the driving method. The AM-type OLED display device may include a circuit that uses a thin film transistor (TFT). The PM-type OLED display device may be easily fabricated since the display region may include a simple matrix-type device with anodes and cathodes. However, the application range of the PM-type OLED display device is typically restricted to low-resolution, small-sized display devices because of the problems of resolution, the rise in driving voltage, and shortened life spans of materials. In the AM-type OLED display device, each pixel of a display device may include a TFT so that a constant amount of current can be supplied to each pixel to obtain stable luminescence. Also, since the AM-type OLED display device typically consumes low power, the AM-type OLED display device can realize high-resolution, large-sized display devices.

FIG. 1 is a plan view of a display panel portion of an OLED display device.

Referring to FIG. 1, a display panel portion 100 of the OLED display device can include a display panel 160 having a plurality of pixels, an upper power supply line 110, which is disposed above the display panel 160 and applies a power supply voltage $V_{DD}$, a lower power supply line 130, which is disposed below the display panel 160 and applies the power supply voltage $V_{DD}$, a reference voltage line 120, which is disposed on one side of the display panel 160 and applies a reference voltage $V_{SS}$, a scan driver 140, which is disposed on the other side of the display panel 160 and outputs a scan signal, and a data driver 150, which is disposed below the lower power supply line 130 and applies a data signal to the display panel 160.

The display panel 160 may include a plurality of pixels (not shown) formed in regions that may be defined by a plurality of scan lines (not shown) and a plurality of data lines (not shown). Each of the pixels may include a combination of red (R), green (G), and blue (B) sub-pixels and may receive the data signal and the scan signal from the data line and the scan line, respectively.

The upper and lower power supply lines 110 and 130 may transmit a constant power supply voltage $V_{DD}$ to the pixels of the display panel 160. Thus, the upper and lower power supply lines 110 and 130 may be connected to the pixels of the display panel 160 and can apply the power supply voltage $V_{DD}$ from an external power supply to the pixels. The upper and lower power supply lines 110 and 130 may be internally connected to each other. Although the upper and lower power supply lines 110 and 130 may receive separate voltages and apply the voltages to the pixels, the upper and lower power supply lines 110 and 130 generally receive the same voltage and apply the voltage to the pixels.

The data driver 150 applies the data signal to the pixels through the data lines and the scan driver 140 applies the scan signal to the pixels through the scan lines, so that the pixels can be driven.

The display panel portion 100 of the OLED display device can receive the power supply voltage $V_{DD}$ from the external power supply and apply the power supply voltage $V_{DD}$ to the pixels. In this case, since the voltage applied from the external power supply can differ from the voltage to be applied to the pixels, the OLED display device can require an additional voltage controller, such as a DC-DC converter. As a result, the circuit configuration of the OLED display device can become complicated.

SUMMARY

According to one embodiment, an organic light emitting diode (OLED) display device comprises: a substrate; a secondary battery comprising a first electrode layer, a second electrode layer and an electrolyte layer interposed between the first and second electrode layers; a display panel comprising an array of organic light emitting diodes formed over the substrate, wherein the battery is interposed between the substrate and the display panel; and a power supply voltage line formed over the substrate and outside the display panel, wherein the power supply voltage line electrically interconnects the secondary battery and the display panel.

According to another embodiment a method of fabricating an OLED display device comprises: providing a substrate; forming a secondary battery over the substrate comprising a first electrode layer, a second electrode layer and an electrolyte layer interposed between the first and second electrode layers; forming an array of transistor circuits over the secondary battery; and forming an array of organic light emitting diodes over the array of transistor circuits.

BRIEF DESCRIPTION OF THE DRAWINGS

The above and other features of the present disclosure will be described with respect to certain exemplary embodiments thereof with reference to the attached drawings in which.

DETAILED DESCRIPTION

Figure 1:
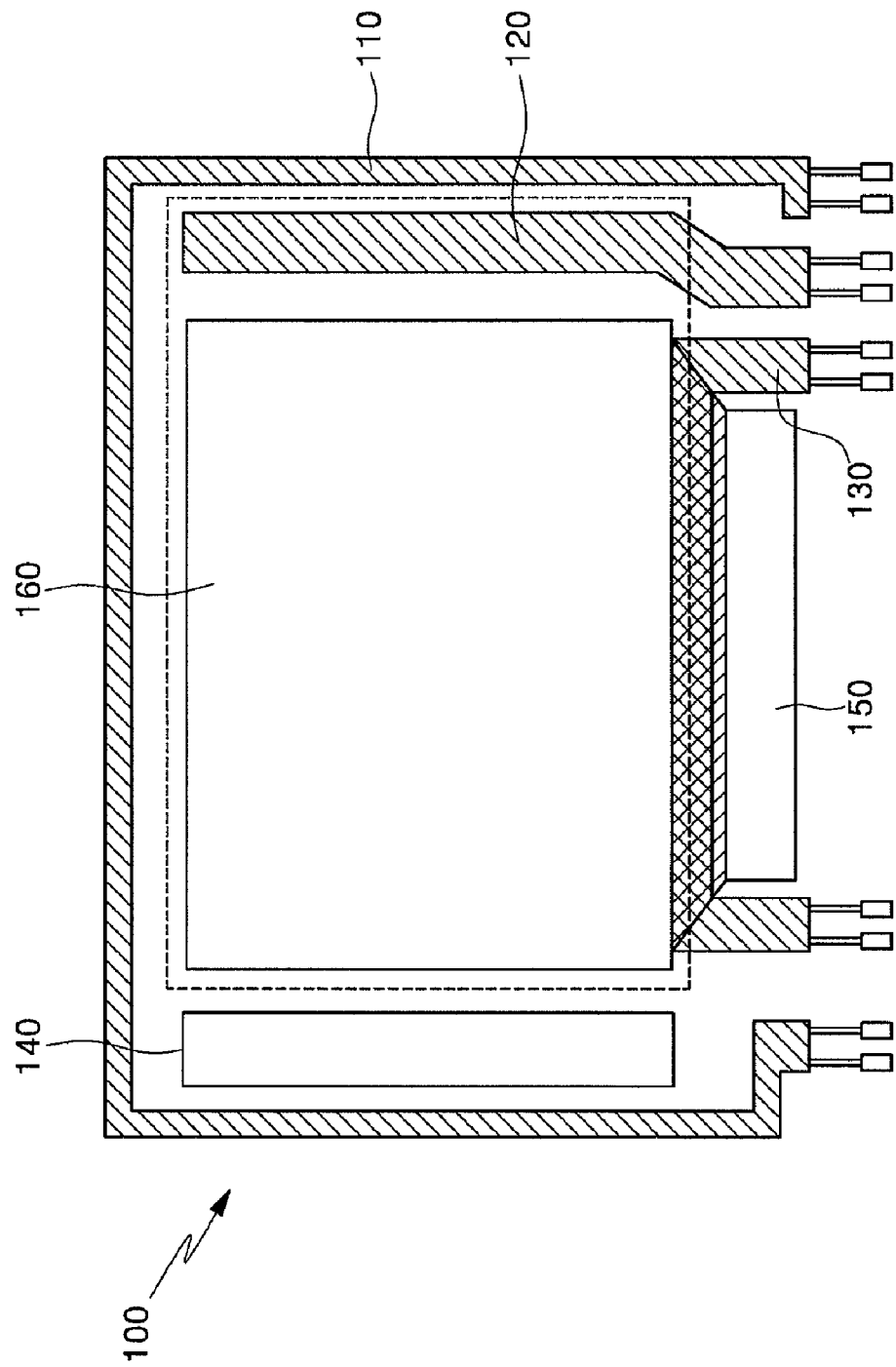
FIG. 1 is a plan view of a display panel portion of one example of an organic light emitting diode (OLED) display device.

The present disclosure will be described more fully hereinafter with reference to the accompanying drawings, in which exemplary embodiments of the invention are shown. The thicknesses of layers or regions shown in the drawings are exaggerated for clarity. The same reference numerals are used to denote the same elements throughout the specification.

Figure 2A:
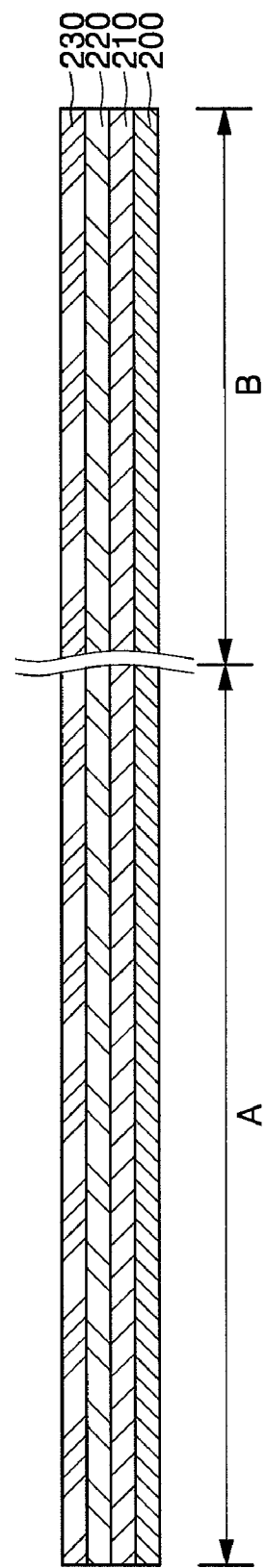
FIGS. 2A through 2C are cross-sectional views illustrating a method of fabricating an OLED display device according to one embodiment.
Figure 2B:
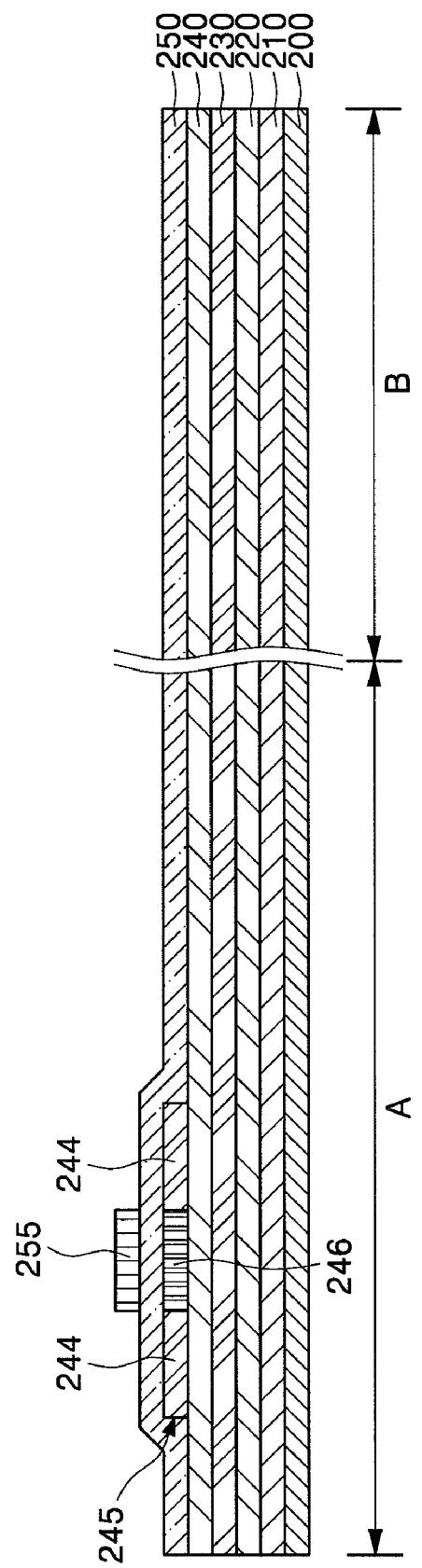
Figure 2C:
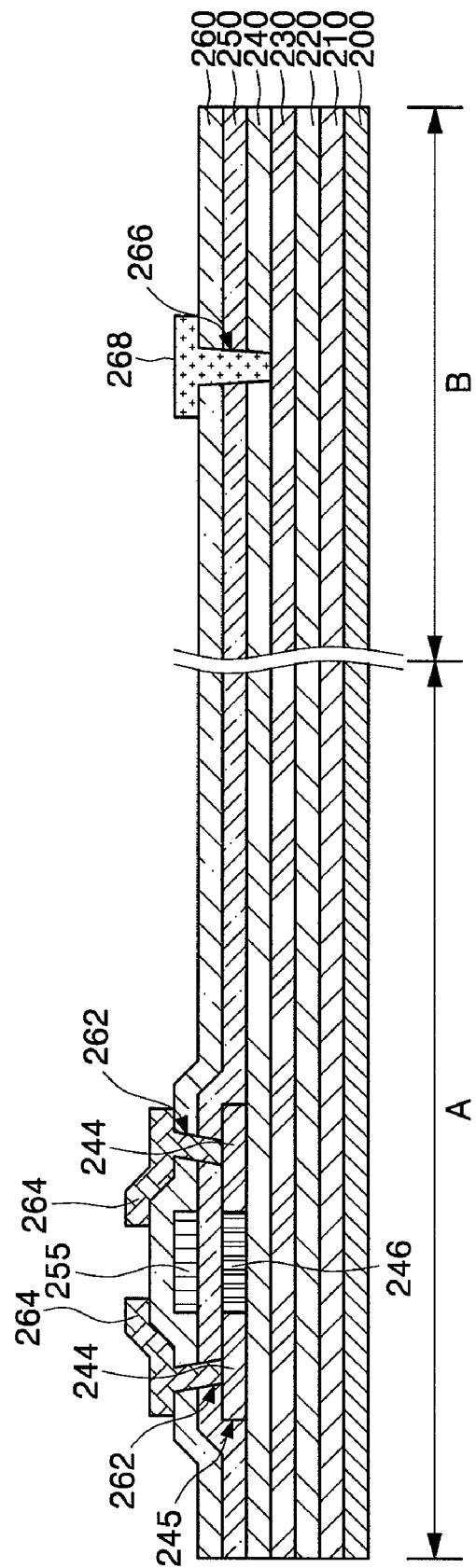

FIGS. 2A through 2C are cross-sectional views illustrating a method of fabricating an organic light emitting diode (OLED) display device according to an exemplary embodiment.

Referring to FIG. 2A, the OLED display device according to an exemplary embodiment is formed by glass, synthetic resin, or stainless steel. A secondary battery including a first electrode layer 210, an electrolyte layer 220, and a second electrode layer 230 is formed on a substrate 200 having a pixel region A and a wiring region B.

The first and second electrode layers 210 and 230 may have polarities opposite each other, and may be formed by coating an electrode active material layer (not shown) on the surface of an electrode collector (not shown). The electrode collector may be formed by a material selected from the group consisting of stainless steel, nickel, copper, aluminum, and an alloy thereof. Specifically, a positive electrode collector may be formed by aluminum or an aluminum alloy, and a negative electrode collector may be formed by copper or a copper alloy, so that the efficiency of the secondary battery can be maximized.

A negative electrode active material layer, which is coated on a negative electrode collector, may be formed by a carbon material, such as crystalline carbon, amorphous carbon, a carbon composite, or a carbon fiber, a lithium metal, or a lithium alloy. Also, a positive electrode active material layer, which is coated on a positive electrode collector, may be formed by a lithium-containing transition metal oxide or lithium chalcogenide compound. For example, the positive electrode active material layer may be formed by $LiCoO_2$, $iNiO_2$, $LiMnO_2$, $LiMn_2O_4$, or $LiNi_{1-x-y}Co_xM_yO_2$ (where $0 \leq x \leq 1$, $0 \leq y \leq 1$, $0 \leq (x+y) \leq 1$, and M is a metal such as Al, Sr, Mg, and La).

The electrolyte layer 220 may prevent a short circuit between the first electrode layer 210 and the second electrode layer 230 and provide a path through which lithium ions pass. According to an embodiment, the electrolyte layer 220 may be formed by a solid electrolyte, such as LiPON. Accordingly, the electrolyte layer 220 can be obtained by a deposition process typically used to fabricate an OLED display device such as, for example, a plasma-enhanced chemical vapor deposition (PECVD) or a sputtering process.

Referring to FIG. 2B, a first insulating layer 240 may be formed on the substrate 200 having the secondary battery so that the secondary battery is electrically insulated from an organic light emitting diode and a TFT to be formed in subsequent processes as described further below. The first insulating layer 240 may be of a material selected from the group consisting of a silicon oxide ($SiO_2$) layer, a silicon nitride ($SiN_x$) layer, and a stacked layer thereof.

Thereafter, an amorphous silicon (a-Si) layer (not shown) may be deposited on the first insulating layer 240 in the pixel region A and then crystallized into a polycrystalline silicon (poly-Si) layer (not shown). The poly-Si layer may be patterned to form a semiconductor layer 245, and a gate insulating layer 250 may be deposited on the substrate 200 over the semiconductor layer 245. In the illustrated embodiment, the gate insulating layer 250 may be of a material selected from the group consisting of a silicon oxide ($SiO_2$) layer, a silicon nitride ($SiN_x$) layer, and a stacked layer thereof.

A metal layer (not shown) for a gate electrode may be formed on the gate insulating layer 250. The metal layer may be a single layer of aluminum (Al), or an aluminum alloy such as aluminum-neodymium (Al—Nd), or a double layer obtained by stacking an aluminum alloy on a molybdenum (Mo) alloy. The metal layer may then be etched using photolithography and etching processes to form a gate electrode 255 in a specific region corresponding with the semiconductor layer 245. The specific region may be a region corresponding with a channel region 246 to be formed in a subsequent process as further described below.

Subsequently, the semiconductor layer 245 may be doped with conductive impurity ions using the gate electrode 255 as a mask, thereby forming source and drain regions 244. A region interposed between the source and drain regions 244 can function as the channel region 246. In another case, the doping process may be performed using photoresist before the gate electrode 255 is formed.

Referring to FIG. 2C, an interlayer insulating layer 260 may be formed on the substrate 200 over the gate electrode 255, and the gate insulating layer 250 and the interlayer insulating layer 260 in the pixel region A may be etched using photolithography and etching processes, thereby forming a first contact hole 262 partially exposing the source and drain regions 244 of the semiconductor layer 245. Also, the gate insulating layer 250, the interlayer insulating layer 260, and the first insulating layer 240 in the wiring region B may be etched using photolithography and etching processes, thereby forming a second contact hole 266 partially exposing the second electrode layer 230 of the secondary battery. In the illustrated embodiment, before the gate insulating layer 250 is formed, the first insulating layer 240 in the wiring region B may be etched using photolithography and etching processes to form an opening partially exposing the second electrode layer 230. Thereafter, portions of the gate insulating layer 250 and the interlayer insulating layer 260 corresponding with the opening may be etched using photolithography and etching processes during the formation of the first contact hole 262 in pixel region A, thereby forming the second contact hole 266 in wiring region B.

Thereafter, source and drain electrodes 264 may be formed on the interlayer insulating layer 260 to be connected to the source and drain regions 244 through the first contact holes 262 in pixel region A. A power supply voltage line 268 may also be formed on the interlayer insulting layer 260 to be connected to the second electrode 230 of the secondary battery through the second contact hole 266 in wiring region B. The power supply voltage line 268 may be an upper power supply voltage line, a lower power supply voltage line, or a reference power supply voltage line. The source and drain electrodes 264 in pixel region A and the power supply voltage line 268 in pixel region B may be formed separately, but formed by the same material at the same time to facilitate the fabrication process.

Although not shown in the figures, a protective layer may be formed on the TFT including the semiconductor layer 245, the gate electrode 255, the source and drain electrodes 264, and the power supply voltage line 268. Then, an organic light emitting diode (OLED) including a third electrode, one or more organic emission layers, and a fourth electrode may be formed on the protective layer in the pixel region A. According to one embodiment, a planarization layer may be formed on the protective layer, and the third electrode may include a reflective layer pattern. The planarization layer may be an organic insulating layer formed by acryl, an inorganic insulating layer formed by silicon oxide, or a stacked layer thereof.

In the OLED display device according to an exemplary embodiment, a secondary battery may be formed in a lower portion and connected to a power supply voltage line, so that a power supply voltage can be transmitted to a plurality of pixels formed on the display panel. The voltage generated by the secondary battery typically ranges from 3V to 5V, while the voltage applied from the power supply voltage line to drive each of the pixels typically ranges from 4V to 5V. As a result, the OLED display device according to an exemplary embodiment can apply the voltage generated by the secondary battery located in the lower portion to each pixel without requiring an additional voltage controller, such as a DC-DC converter.

Furthermore, in the OLED display device according to an exemplary embodiment, since an electrolyte layer of the secondary battery is formed by a solid electrolyte, the secondary battery may be obtained through a deposition process typically used to fabricate an OLED display device. Therefore, a semi-permanent power supply may be installed inside the OLED display device without the use of additional apparatus, so that even if an external power supply voltage is interrupted, the OLED display device can be driven for a predetermined amount of time.

According to the embodiments described above, a secondary battery can be formed through a fabrication process typically used to form an OLED display device without the use of an additional apparatus. Also, the secondary battery may be connected to a power supply voltage line so that a power supply voltage generated by the secondary battery can be applied to each of the pixels without an additional voltage controller. As a consequence, circuit configuration for the OLED display device can be facilitated.

Although embodiments of the present invention has been described with reference to certain exemplary embodiments thereof, it will be understood by those skilled in the art that a variety of modifications and variations may be made to the present invention without departing from the spirit or scope of the present invention defined in the appended claims, and their equivalents.

What is claimed is:

1. An organic light emitting diode (OLED) display device, comprising:
   a substrate;
   a secondary battery comprising a first electrode layer, a second electrode layer and an electrolyte layer interposed between the first and second electrode layers;
   a display panel comprising an array of organic light emitting diodes formed over the substrate, wherein the battery is interposed between the substrate and the display panel; and
   a power supply voltage line formed over the substrate and outside the display panel, wherein the power supply voltage line electrically interconnects the secondary battery and the display panel.

2. The OLED display device of claim 1, wherein at least one of the first and second electrode layers comprises an electrode collector sublayer and an electrode active material sublayer.

3. The OLED display device of claim 2, wherein the electrode collector comprises a material selected from the group consisting of stainless steel, nickel, copper, aluminum, and an alloy thereof.

4. The OLED display device of claim 2, wherein one of the first and second electrode layers is a negative electrode layer, and the electrode active material layer comprises one negative electrode active material selected from the group consisting of a carbon material, a lithium metal, and a lithium alloy.

5. The OLED display device of claim 2, wherein one of the first and second electrode layers is a positive electrode layer, and wherein the electrode active material layer comprises one positive electrode active material selected from the group consisting of $LiCoO_2$, $LiNiO_2$, $LiMnO_2$, $LiMn_2O_4$, and $LiNi_{1-x-y}Co_xM_yO_2$, wherein $0 \leq x \leq 1$, $0 \leq y \leq 1$, $0 \leq (x+y) \leq 1$, and M is one selected from the group consisting of Al, Sr, Mg, and La.

6. The OLED display device of claim 2, wherein the electrode active material layer is located between the electrode collector and the electrolyte layer.

7. The OLED display device according to claim 1, wherein the electrolyte layer comprises a solid electrolyte.

8. The OLED display device of claim 7, wherein the solid electrolyte comprises LiPON.

9. The OLED display device of claim 1, further comprising an array of transistor circuits interposed between the secondary battery and the array of organic light emitting diodes.

10. The OLED display device of claim 1, further comprising a first insulating layer interposed between the secondary battery and the display panel.

11. The OLED display device of claim 1, wherein the first electrode layer, the second electrode layer and the electrolyte layer of the secondary battery extend substantially throughout and over the substrate.

12. A method of operating an OLED display device comprising:
   providing the OLED display device of claim 1; and
   applying electrical energy stored in the secondary battery so as to stimulate the array of the organic light emitting diodes to display an image on the display panel.

13. A method of fabricating an OLED display device, comprising:
   providing a substrate;
   forming a secondary battery over the substrate comprising a first electrode layer, a second electrode layer and an electrolyte layer interposed between the first and second electrode layers;
   forming an array of transistor circuits over the secondary battery; and
   forming an array of organic light emitting diodes over the array of transistor circuits.

14. The method of claim 13, wherein the first electrode layer comprises an electrode collector sublayer an electrode active material sublayer.

15. The method of claim 13, wherein the first electrode layer is a negative electrode layer comprising a negative electrode active material selected from the group consisting of a carbon material, a lithium metal, and a lithium alloy.

16. The method of claim 13, wherein the first electrode layer is a positive electrode layer comprising a positive electrode active material selected from the group consisting of $LiCoO_2$, $LiNiO_2$, $LiMnO_2$, $LiMn_2O_4$, and $LiNi_{1-x-y}Co_xM_yO_2$, wherein $0 \leq x \leq 1$, $0 \leq y \leq 1$, $0 \leq (x+y) < 1$, and wherein M is one selected from the group consisting of Al, Sr, Mg, and La.

17. The method of claim 13, wherein the electrolyte layer is formed of a solid electrolyte.

18. The method of claim 17, wherein the solid electrolyte comprises LiPON.

19. The method of claim 13,
wherein forming the array of transistors comprises:
forming a first insulating layer over the secondary battery;
forming a semiconductor layer over the first insulating layer in a first region;
forming a gate insulating layer over the semiconductor layer and the first insulating layer;
forming a gate electrode on the gate insulating layer over the semiconductor layer;
forming an interlayer insulating layer over the gate electrode and the gate insulating layer;
forming a first hole by etching the interlayer insulating layer and the gate insulating layer in the first region to partially expose the semiconductor layer;
forming a second hole by etching the interlayer insulating layer, the gate insulating layer, and the first insulating layer in a second region to partially expose the secondary battery;
forming a first conductive interconnect in the first hole so as to contact the semiconductor layer; and
forming a second conductive interconnect in the second hole so as to contact the secondary battery;
wherein before forming the gate insulating layer, a third hole is formed in the first insulating layer in the second region to partially expose the battery, and portions of the interlayer insulating layer and the gate insulating layer over the third hole are etched during the etching of the interlayer insulating layer and the gate insulating layer in the first region, to form the second contact hole.

20. The method of claim 13, further comprising,
forming at least one electrically insulating layer over the secondary battery;
forming a hole through the at least one electrically insulating layer to expose one of the first and second electrodes of the secondary battery;
forming an electrically conductive interconnect in the hole so as to contact the one of the first and second electrodes of the secondary battery; and
forming a wiring interconnecting the electrically conductive interconnect and the array of organic light emitting diodes.

* * * * *

UNITED STATES PATENT AND TRADEMARK OFFICE
CERTIFICATE OF CORRECTION

| | | |
|---|---|---|
| PATENT NO. | : 7,863,629 B2 | Page 1 of 1 |
| APPLICATION NO. | : 11/935943 | |
| DATED | : January 4, 2011 | |
| INVENTOR(S) | : Hyun-Chul Son | |

It is certified that error appears in the above-identified patent and that said Letters Patent is hereby corrected as shown below:

In Column 8, Line 11, change "comprising," to --comprising:--.

Signed and Sealed this
Twentieth Day of September, 2011

David J. Kappos
*Director of the United States Patent and Trademark Office*